(12) United States Patent
Joo et al.

(10) Patent No.: US 9,295,153 B2
(45) Date of Patent: *Mar. 22, 2016

(54) METHOD OF MANUFACTURING A PATTERNED TRANSPARENT CONDUCTOR

(71) Applicant: Rohm and Haas Electronic Materials LLC, Marlborough, MA (US)

(72) Inventors: Jaebum Joo, Somerville, ME (US); Jerome Claracq, Oostakker (BE); Garo Khanarian, Princeton, NJ (US); Kathleen M. O'Connell, Cumberland, RI (US); Lijia Bu, Southborough, ME (US); Peter Trefonas, Medway, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 281 days.

This patent is subject to a terminal disclaimer.

(21) Appl. No.: 14/074,390

(22) Filed: Nov. 7, 2013

(65) Prior Publication Data

US 2014/0131078 A1    May 15, 2014

Related U.S. Application Data

(60) Provisional application No. 61/726,213, filed on Nov. 14, 2012.

(51) Int. Cl.
| | |
|---|---|
| H05K 3/02 | (2006.01) |
| H05K 1/09 | (2006.01) |
| H01B 1/02 | (2006.01) |
| G06F 3/041 | (2006.01) |
| H01L 31/18 | (2006.01) |
| H01B 1/22 | (2006.01) |
| H05K 3/12 | (2006.01) |
| G06F 3/044 | (2006.01) |

(52) U.S. Cl.
CPC .............. H05K 1/097 (2013.01); G06F 3/041 (2013.01); H01B 1/02 (2013.01); H01B 1/22 (2013.01); H01L 31/1884 (2013.01); H05K 3/02 (2013.01); G06F 3/044 (2013.01); G06F 2203/04103 (2013.01); H05K 3/1283 (2013.01); H05K 2201/0108 (2013.01); Y02E 10/50 (2013.01); Y10T 29/49155 (2015.01)

(58) Field of Classification Search
CPC ............. Y10T 29/49155; Y10T 29/49124; Y10T 29/49117; Y10T 29/49002; G06F 3/041; H01B 13/00; H01B 1/02; H01B 1/22; H05K 1/097; H05K 2201/0108; H05K 3/02; H05K 3/1283; Y02E 10/50
USPC ......... 977/701, 848, 859, 856, 857, 858, 762, 977/700, 952, 932, 902; 29/846, 829, 825, 29/592.1; 427/98.4, 96.1, 58, 125; 174/257, 256, 250, 68.1
See application file for complete search history.

(56) References Cited

U.S. PATENT DOCUMENTS

| | | | |
|---|---|---|---|
| 7,794,634 B2* | 9/2010 | Ripoll ................... | B82Y 30/00 204/164 |
| 7,956,525 B2 | 6/2011 | Armitage et al. | |
| 7,968,804 B2 | 6/2011 | Frey et al. | |
| 8,018,568 B2* | 9/2011 | Allemand ............. | B82Y 10/00 349/187 |
| 8,049,333 B2 | 11/2011 | Alden et al. | |
| 8,094,247 B2 | 1/2012 | Allemand et al. | |
| 8,772,780 B2 | 7/2014 | Huang et al. | |
| 9,148,969 B2* | 9/2015 | Claracq ................... | H05K 7/00 |
| 2005/0233159 A1 | 10/2005 | Tour et al. | |
| 2006/0228543 A1 | 10/2006 | Lu et al. | |
| 2011/0217451 A1 | 9/2011 | Veerasamy | |
| 2012/0018200 A1 | 1/2012 | Hwa et al. | |
| 2012/0138913 A1 | 6/2012 | Alsayed et al. | |
| 2012/0189795 A1* | 7/2012 | Wong ................... | D01D 5/0069 428/36.91 |
| 2013/0056244 A1* | 3/2013 | Srinivas ................. | G06F 3/041 174/250 |
| 2013/0078436 A1 | 3/2013 | Naito et al. | |

FOREIGN PATENT DOCUMENTS

WO       2013166668       11/2013

OTHER PUBLICATIONS

Bober, et al., Polyaniline-coated silver nanowires, Reactive & Functional Polymers, 70, pp. 656-662 (2010).

(Continued)

*Primary Examiner* — Peter DungBa Vo
*Assistant Examiner* — Azm Parvez
(74) *Attorney, Agent, or Firm* — Thomas S. Deibert

(57) ABSTRACT

Method of manufacturing patterned transparent conductor is provided, comprising: providing a silver ink core component containing silver nanoparticles dispersed in a silver carrier; providing a shell component containing a film forming polymer dispersed in a shell carrier; providing a substrate; coelectrospinning the silver ink core component and the shell component to form a core shell fiber, wherein the silver nanoparticles are in the core; depositing the core shell fiber on the substrate; selectively treating a portion of the deposited core shell fiber to provide a patterned transparent conductor, wherein the patterned transparent conductor has a treated region and a non-treated region; wherein the treated region comprises a plurality of electrically interconnected silver miniwires and wherein the treated region is an electrically conductive region; and, wherein the non-treated region is an electrically insulative region.

9 Claims, No Drawings

(56) References Cited

OTHER PUBLICATIONS

Yun, et al., Transparent conducting films based on graphene oxide/silver nanowire hybrids with high flexibility, Synthetic Metals, 162, pp. 1364-1368 (2012).

Tien, et al., Using self-assembly to prepare a graphene-silver nanowire hybrid film that is transparent and electrically conductive, Carbon, 58, pp. 198-207 (Mar. 5, 2013).

* cited by examiner

METHOD OF MANUFACTURING A PATTERNED TRANSPARENT CONDUCTOR

This application claims priority to U.S. Provisional Application No. 61/726,213 filed on Nov. 14, 2012.

The present invention relates generally to the field of manufacture of patterned transparent conductors. In particular, the present invention is directed to a method of manufacturing of an invisible patterned transparent conductor.

Films that exhibit a high conductivity in combination with a high transparency are of great value for use as electrodes or coatings in a wide range of electronic applications, including, for example, touch screen displays and photovoltaic cells. Current technology for these applications involves the use of a tin doped indium oxide (ITO) containing films that are deposited through physical vapor deposition methods. The high capital cost of physical vapor deposition processes has led to the desire to find alternative transparent conductive materials and coating approaches. The use of silver nanowires dispersed as a percolating network has emerged as a promising alternative to ITO containing films. The use of silver nanowires potentially offer the advantage of being processable using roll to roll techniques. Hence, silver nanowires offer the advantage of low cost manufacturing with the potential of providing higher transparency and conductivity than conventional ITO containing films.

In capacitive touch screen applications, conductive patterns are required. One of the key challenges for such applications is that the patterns formed must be invisible (or nearly so) to the human eye.

One approach to providing nanowire based, patterned, transparent conductors has been disclosed by Allemand et al, in U.S. Pat. No. 8,018,568. Allemand et al. disclose an optically uniform transparent conductor comprising: a substrate; a conductive film on the substrate, the conductive film including a plurality of interconnecting nanostructures, wherein a pattern on the conductive film defines (1) an unetched region having a first resistivity, a first transmission and a first haze and (2) an etched region having a second resistivity, a second transmission and a second haze; and, wherein the etched region is less conductive than the unetched region, a ratio of the first resistivity over the second resistivity is at least 1000; the first transmission differs from the second transmission by less than 5%; and the first haze differs from the second haze by less than 0.5%.

Notwithstanding, there remains a need for an alternative method of manufacturing a patterned transparent conductor having an electrically conductive region and a non-electrically conductive region, wherein the electrically conductive region and the non-electrically conductive region are essentially indistinguishable to the human eye (i.e., the difference in the light transmission, $\Delta_{Trans}$, and haze, $\Delta_{Haze}$, exhibited by the electrically conductive region and the non-electrically conductive region are both treated and non-treated regions of the patterned transparent conductor are preferably both ≤1%).

The present invention provides a method of manufacturing a patterned transparent conductor, comprising: providing a silver ink core component containing silver nanoparticles dispersed in a silver carrier; providing a shell component containing a film forming polymer dispersed in a shell carrier; providing a substrate; coelectrospinning the silver ink core component and the shell component to form a core shell fiber having a core and a shell surrounding the core, wherein the silver nanoparticles are in the core; depositing the core shell fiber on the substrate to provide a deposited core shell fiber; selectively treating a portion of the deposited core shell fiber to provide a patterned transparent conductor, wherein the patterned transparent conductor has a treated region and a nontreated region; wherein the treated region comprises a plurality of electrically interconnected silver miniwires and wherein the treated region is an electrically conductive region; and, wherein the non-treated region is an electrically insulative region.

The present invention provides a patterned transparent conductor manufactured by the method of the present invention.

DETAILED DESCRIPTION

The term "$Trans_{Treat}$" used herein and in the appended claims refers to the light transmission (in %) exhibited by the treated portion of the patterned transparent conductor of the present invention measured according to ASTM D1003-11e1.

The term "$Trans_{Non}$" used herein and in the appended claims refers to the light transmission (in %) exhibited by the non treated portion of the patterned transparent conductor of the present invention measured according to ASTM D1003-11e1.

The term "$Haze_{Treat}$" used herein and in the appended claims refers to the haze (in %) exhibited by the treated portion of the patterned transparent conductor of the present invention measured according to ASTM D1003-11e1.

The term "$Haze_{Non}$" used herein and in the appended claims refers to the haze (in %) exhibited by the non treated portion of the patterned transparent conductor of the present invention measured according to ASTM D1003-11e1.

The term "$\Delta_{Trans}$" used herein and in the appended claims refers to the difference in transmission exhibited by the treated region compared to the non treated region of the patterned transparent conductor of the present invention as defined by the following expression:

$$\Delta_{Trans} = \text{(the absolute value of } (Trans_{Treat} - Trans_{Non})).$$

The term "$\Delta_{Haze}$" used herein and in the appended claims refers to the difference in the haze exhibited by the treated region compared to the non treated region of the patterned transparent conductor of the present invention as defined by the following expression:

$$\Delta_{Haze} = \text{(the absolute value of } (Haze_{Treat} - Haze_{Non})).$$

The term "Invisible Patterned Transparent Conductor" used herein and in the appended claims refers to a patterned transparent conductor that exhibits a $\Delta_{Trans}$ of ≤1% and a $\Delta_{Haze}$ of ≤1%.

Invisible patterned transparent conductors made using the method of the present invention are particularly useful in capacitive touch screen applications. For use is such applications, it is desirable to provide a transparent conductor having a pattern of electrically conducting and non-electrically conducting regions. One significant challenge in providing such patterned transparent conductors is in making the pattern undetectable to the human eye (i.e., $\Delta_{Trans}$ and $\Delta_{Haze}$ both ≤1%) to minimize degradation in the viewing properties of the screen.

Preferably, the silver ink core component used in the present invention, comprises ≥50 wt % (more preferably ≥60 wt %; still more preferably ≥70 wt %; most preferably ≥75 wt %) silver nanoparticles dispersed in a silver carrier.

Preferably, the silver nanoparticles used in the silver ink core component exhibit an aspect ratio of ≤2 (more preferably ≤1.5; most preferably ≤1.1). The silver nanoparticles used optional comprise a treatment or surface coating to facilitate the formation of a stable dispersion in the silver carrier and to inhibit the formation of agglomerates.

Silver carrier used in the method of the present invention can be selected from any liquid in which the silver nanoparticles can be dispersed. Preferably, the silver carrier is selected from the group consisting of water, alcohol and mixtures thereof. More preferably, the silver carrier is selected from the group consisting of water; $C_{1-4}$ alcohol (e.g., methanol, ethanol, propanol, isopropanol, butanol); dimethyl sulfoxide; N,N-dimethyl formamide; 1-methyl-2-pyrrolidone; trimethyl phosphate and mixtures thereof. Most preferably, the silver carrier is water.

The silver ink core component used in the method of the present invention, optionally, further comprises a core additive. Core additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred core additives include surfactants and antioxidants.

Preferably, the shell component used in the method of the present invention, comprises a film forming polymer dispersed in a shell carrier.

Film forming polymer used in the method of the present invention can be selected from known electrospinnable film forming materials. Preferred film forming polymers include polyacrylic acid, polyethylene oxide, polyvinyl alcohol, polyvinyl propylene, cellulose (e.g., hydroxy propyl cellulose, nitrocellulose), silk and blends thereof. More preferably, the film forming polymer is polyethylene oxide. Most preferably, the film forming polymer is polyethylene oxide having a weight average molecular weight of 10,000 to 1,000,000 g/mol.

Shell carrier used in the method of the present invention can be selected from any liquid in which the film forming polymer is dispersible. Preferably, the shell carrier can be any good solvent for the film forming polymer. More preferably, the shell carrier is selected such that the interfacial tension between the shell component and the silver ink core component is >0.1 mN/m (preferably, >1 mN/m; more preferably, >2 mN/m; most preferably 2 to 5 mN/m). When used in combination with a silver ink core component having water as the silver carrier, the shell carrier is preferably selected from the group consisting of a water alcohol mixture; wherein the alcohol is selected from the group consisting of acetone, $C_{1-4}$ alcohols (e.g., methanol, ethanol, isopropanol, propanol, butanol, tert-butanol) and mixtures thereof; and wherein the water alcohol mixture exhibits an alcohol concentration of ≥50 wt % (more preferably >50 wt %).

The shell component used in the method of the present invention, optionally, further comprises a shell additive. Shell additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred shell additives include surfactants and antioxidants.

A particularly preferred shell component used in the method of the present invention, comprises 1 to 25 wt % (more preferably 1 to 15 wt %; most preferably 2 to 10 wt %) film forming polymer dispersed in a water and $C_{1-4}$ alcohol mixture shell carrier. Preferably, the shell carrier is a water and $C_{1-4}$ alcohol mixture having an alcohol concentration ≥50 wt % (most preferably ≥60 wt % alcohol). Most preferably, the shell component comprises 2 to 10 wt % polyethylene oxide in a shell carrier, wherein the shell carrier is a water ethanol mixture having an ethanol content of ≥50 wt %.

Substrate used in the method of the present invention can be selected from any known substrates, including: both conductive and nonconductive substrates. Preferred substrates are transparent. More preferred substrates include glass (e.g., Willow® glass available from Corning, Inc.) and transparent plastic films (e.g., polyethylene, polyethylene terephthalate, polycarbonate, poly methyl methacrylate).

The method of manufacturing a patterned transparent conductor of the present invention, comprises: providing a silver ink core component containing silver nanoparticles dispersed in a silver carrier; providing a shell component containing a film forming polymer dispersed in a shell carrier; providing a substrate; coelectrospinning the silver ink core component and the shell component to form a core shell fiber having a core and a shell surrounding the core, wherein the silver nanoparticles are in the core; depositing the core shell fiber on the substrate to provide a deposited core shell fiber; selectively treating a portion of the deposited core shell fiber to provide a patterned transparent conductor, wherein the patterned transparent conductor has a treated region and a non-treated region; wherein the treated region comprises a plurality of electrically interconnected silver miniwires and wherein the treated region is an electrically conductive region; and, wherein the non-treated region is an electrically insulative region.

Preferably, in the method of the present invention, the core shell fiber is deposited on the substrate in an overlapping pattern selected from the group consisting of a random overlapping pattern, a periodic pattern, an aperiodic pattern and a controlled overlapping pattern.

Preferably, in the method of the present invention, coelectrospinning comprises feeding the silver ink core component and the shell component through a coannular nozzle having a central opening and a surrounding annular opening, wherein the silver ink core component is fed through the central opening and the shell component is fed through the surrounding annular opening. Preferably, the ratio of the volumetric flow rate of the shell material, $VFR_{shell}$, fed through the surrounding annular opening to the volumetric flow rate of the core material, $VFR_{core}$, fed through the central opening is greater than or equal to the ratio of the cross sectional area of the surrounding annular opening perpendicular to the direction of flow, $CSA_{annular}$, to the cross sectional area of the central opening perpendicular to the direction of flow, $CSA_{center}$. More preferably, the following expression is satisfied by the processing conditions:

$$VFR_{shell}/VFR_{core} \geq 1.2*(CSA_{annular}/CSA_{center}).$$

Most preferably, the following expression is satisfied by the processing conditions:

$$VFR_{shell}/VFR_{core} \geq 1.4*(CSA_{annular}/CSA_{center}).$$

Preferably, in the method of the present invention, the silver ink core component is fed through the central opening at a volumetric flow rate of 0.1 to 3 μL/min (preferably 0.1 to 1 μL/min; more preferably 0.1 to 0.7 μL/min; most preferably 0.4 to 0.6 μL/min).

Preferably, in the method of the present invention, the shell component is fed through the surrounding annular opening at a flow of 1 to 30 μL/min (preferably 1 to 10 μL/min; more preferably 1 to 7 μL/min; most preferably 4 to 6 μL/min).

Preferably, in the method of the present invention, the coannular nozzle is set at an applied positive difference of electric potential relative to the substrate. More preferably, wherein the applied electric potential difference is 5 to 50 kV (preferably, 5 to 30 kV; more preferably, 5 to 25 kV; most preferably, 5 to 10 kV).

In the method of the present invention, the core shell fiber can be directly coelectrospun onto the substrate. That is, the core shell fiber can simultaneously be electrospun and deposited onto the substrate. Alternatively, the core shell fiber can be coelectrospun onto a target surface other than the substrate. The core shell fiber can then be recovered from the target surface and combined with an optional matrix material and/or an optional vehicle to form a combination. The combination can then be deposited onto the substrate.

The optional matrix material used in the method of the present invention is not particularly limiting. One of ordinary skill in the art will be able to select an appropriate matrix material based on the desired end use application for the film prepared using the method of the present invention. Preferably, the matrix material is selected from the group consisting of polyethylene, polypropylene, polyvinyl chloride, styrenic, polyurethane, polyimide, polycarbonate, polyethylene terephthalate, cellulose, gelatin, chitin, polypeptides, polysaccharides and mixtures thereof. More preferably, the matrix material is selected from the group consisting of transparent cellulose ester polymers and transparent cellulose ether polymers.

The optional vehicle used in the method of the present invention is not particularly limiting. One of ordinary skill in the art will be able to select an appropriate vehicle for use with the method of the present invention. Preferably, the vehicle is selected from the group consisting of organic solvents and aqueous solvents. More preferably, the vehicle is selected from $C_{1-5}$ alcohols, toluene, xylene, methyl ethyl ketone (MEK), water and mixtures thereof. Most preferably, the vehicle is water.

The recovered core shell fiber, the optional matrix material and the optional vehicle can be combined to form the combination using well known mixing techniques.

Preferably, the combination used in the method of the present invention includes 2 to 15 wt % (more preferably 2 to 10 wt %) core shell fiber; 5 to 70 wt % (more preferably 5 to 20 wt %) matrix material; 0 to 85 wt % (more preferably 50 to 75 wt %) vehicle.

The combination can be applied to the surface of the substrate using well known deposition methods. Preferably, the combination is applied to a surface of the substrate using a process selected from the group consisting of spray painting, dip coating, spin coating, knife coating, kiss coating, gravure coating, screen printing, ink jet printing and pad printing. More preferably, the combination is applied to a surface of the substrate using a process selected from the group consisting of dip coating, spin coating, knife coating, kiss coating and gravure coating. Most preferably, the combination is applied to a surface of the substrate by spin coating.

Preferably, any volatile components contained in the combination deposited on the surface of the substrate are removed. Preferably, the volatile components are removed by baking. Preferably, the concentration of core shell fiber post removal of the volatile components is 10 to 40 wt % (more preferably 15 to 35 wt %; most preferably 15 to 25 wt %).

In the method of the present invention, a portion of the deposited core shell fiber is selectively treated to provide a patterned transparent conductor, wherein the patterned transparent conductor has a treated region and a non-treated region. Preferably, the treated region is treated using a technique selected from the group consisting of sintering (e.g., photosintering, thermal sintering); heating (e.g., burn-off, micro pulse photonic heating, continuous photonic heating, microwave heating, oven heating, furnace heating) and a combination thereof. More preferably, the treated region is treated by selectively treating the deposited core shell fiber in the treated region by photosintering. Still more preferably, the treated region is treated by selectively treating the deposited core shell fiber in the treated region by interposing a mask between the deposited core shell fiber and a source; and, emitting a high intensity photon pulse from the source; wherein the deposited core shell fiber in the treated region is exposed to the high intensity photon pulse and the deposited core shell fiber in the non-treated portion is shielded from exposure to the high intensity photon pulse by the mask; wherein the high intensity photon pulse transforms the exposed silver nanoparticles in the deposited core shell fiber in the treated region into a conductive network. More preferably, wherein the exposed silver nanoparticles are fused or sintered into a plurality of electrically interconnected conductive structures. Most preferably, wherein the exposed silver nanoparticles are fused or sintered into a plurality of electrically interconnected silver miniwires. Preferably, wherein the population of silver miniwires exhibit an average diameter, D, of ≤5 μm (preferably 100 nm to 5 μm; more preferably 1 to 5 μm) and an average length, L, of ≥60 μm (preferably 60 to 10,000 μm; more preferably 100 to 10,000 μm; still more preferably 200 to 10,000 μm; most preferably 500 to 10,000 μm)(preferably, wherein the aspect ratio, L/D, of the silver miniwires is ≥150 (more preferably ≥200; still more preferably ≥500; most preferably ≥1,000)).

Preferably, in the method of the present invention, the treated region is formed in a controlled pattern on the substrate. Preferably, the controlled pattern is selected from the group consisting of a regular pattern and an irregular pattern. More preferably, the treated region is formed in an irregular pattern. Preferably, the controlled pattern is a grid pattern. Grid patterns include, for example, straight sided polygons (such as, diamonds, squares, rectangles, triangles, hexagons, etc.); circles; multi-curved shapes; combination curved and straight sided shapes (e.g., semi-circles); and, combinations thereof.

Preferably, selectively treating a portion of the deposited core shell fiber to provide a patterned transparent conductor, comprises: providing a mask; disposing the mask over a surface of the substrate to facilitate the selective treatment of a portion of the deposited core shell fiber. One of ordinary skill in the art will know to select an appropriate material for use as a mask in the method of the present invention. Preferably, the material used as a mask is a reflective shadow/optical mask that does not appreciably absorb the energy used for selectively treating the deposited core shell fiber.

Preferably, the patterned transparent conductor made using the method of the present invention exhibits a $\Delta_{Trans}$ of ≤1% (preferably ≤0.5%; more preferably ≤0.1%). Preferably, the patterned transparent conductor made using the method of the present invention exhibits a $\Delta_{Haze}$ of ≤1% (preferably ≤0.5%; more preferably ≤0.1%). Most preferably, the patterned transparent conductor made using the method of the present invention is an invisible patterned transparent conductor that exhibits a $\Delta_{Trans}$ of ≤1% (preferably ≤0.5%; more preferably ≤0.1%) and a $\Delta_{Haze}$ of ≤1% (preferably ≤0.5%; more preferably ≤0.1%).

Preferably, the treated region of the patterned transparent conductor made using the method of the present invention is an electrically conductive region that exhibits a sheet resistance, $R_s$, (as measured using the method described herein in the Example) of <700 Ω/sq (more preferably <100 Ω/sq).

Preferably, the non-treated region of the patterned transparent conductor made using the method of the present invention is an electrically insulative region that exhibits a sheet resistance, $R_s$, (as measured using the method described herein in the Example) of >100 kΩ/sq (more preferably >300 kΩ/sq.

Some embodiments of the present invention will now be described in detail in the following Example.

The transmission, $T_{Trans}$, data reported in the Examples were measured according to ASTM D1003-11e1 using a BYK Instrument's Haze-gard plus transparency meter.

The haze, $H_{Haze}$, data reported in the Examples were measured according to ASTM D1003-e1 using a BYK Instrument's Haze-gard plus transparency meter.

EXAMPLE 1

Preparation Patterned Transparent Conductive Film

A dual nozzle electrospinning machine Model EC-DIG from IME Technologies was used to electrospin the core shell fiber. The nozzle used was a coaxial nozzle (EM-CAX from IME Technologies) having an inner opening having a circular cross section perpendicular to the direction of material flow having a 0.4 mm diameter; and, an outer opening having an annular cross section perpendicular to the direction of material flow and concentric with the inner opening; and having a 0.6 mm inner diameter and a 1.2 mm outer diameter. When spinning material, the silver ink core component was fed through the inner opening of the coaxial nozzle and the shell component was fed through the outer opening of the coaxial nozzle. The silver ink core component and the shell component were fed through the coaxial nozzle using independent syringe pumps (EP-NE1 from IME Technologies) controlling the volumetric flow rate of the silver ink core component. $VFR_{core}$, at 2.5 μL/min and the volumetric flow rate of the shell component, $VFR_{shell}$, at 18 μL/min. The electrospinning process was performed at ambient atmospheric conditions in a climate controlled laboratory at 20° C. and relative humidity of 25-35%.

The silver ink core component used comprised 70 wt % silver nanoparticles with a nominal particle size of 50 nm dispersed in water (Available from Cabot Corporation as CSD95). The shell component used comprises 5.5 wt % polyethylene oxide (400,000 g/mol from Aldrich) dissolved in a 40/60 wt % water/ethanol solution; wherein the interfacial tension between the silver ink core component and the shell component was measured to be 2-5 mN/m.

The substrate used was a 188 μm thick×12.7 cm wide× 30.48 cm long transparent, flexible, polyethylene terephthalate (PET) film (Skyrol®V5200 available from SKC, Inc.). The substrate was wrapped around the rotary drum of a Module EM-RDC rotating drum collector from IME Technologies.

The remaining parameters for the spinning operation were as follows: the distance between the rotating substrate and the needle was set at 18 cm; the nozzle was set at 6.5 kV; the plate beneath the substrate was set at −0.1 kV; the drum rotation rate on the rotating drum collector (y axis) was set at 250 rpm; the needle scan speed (x axis) was set at 10 mm/sec; the needle scan distance was set at 12 cm; and the total spinning time was set at 4 minutes.

Following the spinning operation, the PET substrate with core shell fiber deposited thereon was removed from the rotating drum collector. A 5 cm×2.5 cm sample was then cut from the substrate. The transmission $T_{Trans}$, of the untreated sample was 79.3%. The haze, $H_{Haze}$, of the untreated sample was 11.8%.

Half of the sample was then covered with a 2.5 cm×2.5 cm, white reflective, plastic mask. The masked sample was then fed through a Pulseforge 3100 photon generator from Novacentrix on a conveyor belt set at a rate of 7.62 m/min. The photon generator was outfitted with a high intensity xenon lamp capable of emitting light over a broad spectrum from UV to short IR. The photon generator was set at 200 V to produce 400 μsec pulses with a 3 Hz frequency on continuous mode generating 552 mJ/cm². The sample exiting the photon generator was a patterned transparent conductor having a treated region (unshielded from the pulses) and an untreated region (shielded from the pulses by the mask). The mask was removed from the patterned transparent conductor. The treated region and the untreated region of the patterned transparent conductor were then analyzed to determine their transmission, $T_{Trans}$, and haze, $H_{Haze}$. Based on the data provided in TABLE 2, the patterned transparent conductor exhibited a of $\Delta_{Trans}$ of 0.5% and a $\Delta_{Haze}$ of 0.7%.

TABLE 2

| Region of Patterned Transparent Conductor | $T_{Trans}$ | $H_{Haze}$ |
|---|---|---|
| treated region | 79.8% | 12.5% |
| non-treated region | 79.3% | 11.8% |

The sheet resistance value for the treated region of the patterned transparent conductor in the Example 1 was measured according to ASTM F390-11 using a Jendel HM-20 colliner 4 point probe test unit from Jandel Engineering Limited. The sheet resistance of the treated portion was 612.73±107.96 Ω/sq.

Comparative Examples A1-A2 and Example 2-3

Preparation of Treated Regions

A dual nozzle electrospinning machine Model EC-DIG from IME Technologies was used to electrospin silver miniwires in the Comparative Examples A1-A2 and Example 2-3. The nozzle used was a coaxial nozzle (EM-CAX from IME Technologies) having an inner opening having a circular cross section perpendicular to the direction of material flow having a 0.4 mm diameter; and, an outer opening having an annular cross section perpendicular to the direction of material flow and concentric with the inner opening; and having a 0.6 mm inner diameter and a 1.2 mm outer diameter. When spinning material, the silver ink core component was fed through the inner opening of the coaxial nozzle and the shell component was fed through the outer opening of the coaxial nozzle. The silver ink core component and the shell component were fed through the coaxial nozzle using independent syringe pumps (EP-NE1 from IME Technologies) controlling the volumetric flow rate of the silver ink core component, $VFR_{core}$, at 0.5 μL/min and the volumetric flow rate of the shell component, $VFR_{shell}$, at 5 μL/min. The electrospinning process was performed at ambient atmospheric conditions in a climate controlled laboratory at 20° C. and relative humidity of 25-35%.

The substrate used for collecting the fibers was a 0.16-0.19 mm thick glass slide having a 60 mm diameter. During the spinning operation, the glass plate was placed on top of a pounded electrode while the spinning head was located vertically above the substrate. A positive electric potential was applied to the spinning head during spinning. The voltage used varied from 9 kV at the start of spinning down to 7 kV once the spinning process became stable.

Photonic sintering referred to in Comparative Examples A1-A2 and Example 2-3 was performed using a Pulseforge 3100 photon generator available from Novacentrix. The photon generator was outfitted with a high intensity xenon lamp capable of emitting light over a broad spectrum from UV to short IR. The photon generator was set up at 350 V to produce 400 μsec pulses with a 5 Hz frequency on continuous mode generating 2.46 J/cm². The samples were fed through the photon generator on a conveyor belt at a rate of 7.62 m/min.

The sheet resistance, $R_s$, values reported in TABLE 2 for the photonic sintered samples were measured according to ASTM F390-11 using a Jendel HM-20 colliner 4 point probe test unit from Jandel Engineering Limited.

The percent transmission versus wavelength measurements reported in TABLE 2 were performed using an HP Lambda 9 UV VIS spectrometer.

Examples 2-3

Treated Region Preparation

In each of Examples 2-3 a core shell fiber was electrospun and deposited onto a glass slide substrate. The silver ink core component used in Examples 2-3 comprised 75 wt % silver nanoparticles with a nominal particle size of 50 nm dispersed in water (Available from Cabot Corporation as CSD-95). The shell component used in the Examples 2-3 comprised 6 wt % polyethylene oxide (400,000 g/mol from Aldrich) dissolved in a 40/60 wt % water/ethanol solution; wherein the interfacial tension between the silver ink core component and the shell component was measured to be 2-5 mN/m.

The sheet resistance of the untreated product of each of Examples 2-3 was measured before and after photonic sintering and is reported in TABLE 2.

The post sintered treated region from Example 2 was analyzed by optical microscopy and observed to exhibit silver miniwires having diameters in the 1-5 μm range and lengths in the 800-1,000 μm range.

The post sintered treated region from Example 2 was analyzed by spectrometer and observed to exhibit a percent transmission of >70% across the visible spectrum from 390 nm to 750 nm.

TABLE 2

| Ex. # | Before Photonic Sintering (in kΩ/sq) | After Photonic Sintering (in Ω/sq) |
| --- | --- | --- |
| 2 | 360.4 ± 36.8 | 44.6 ± 4.6 |
| 3 | 431.5 ± 30.9 | 57.4 ± 2.1 |

Comparative Example A1

The silver ink core component used comprised 60 wt % silver nanoparticles dispersed in water (Available from PChem Associates, Inc. as PFI-722 ink). A variety of shell components were used including the following:
  6 wt % polyacrylic acid in water;
  4 wt % polyethylene oxide in a 60/40 wt % ethanol/water mixture;
  6 wt % polyethylene oxide in a 60/40 wt % isopropanol water mixture;
  8 wt % polyacrylic acid in a 30/20/50 wt % water/isopropanol/butanoyl mixture;
  4-6 wt % polyethylene oxide in a 60/40 wt % ethanol/Water mixture;
  4-8 wt % polyacrylic acid in a 60/40 wt % ethanol/water mixture; and
  4-8 wt % polyacrylic acid in a 40/60 wt % ethanol/water mixture.

The interfacial tension between the silver ink core component and the shell component in each of these systems was measured to be 0.4-2 mN/m.

Efforts to produce a plurality of interconnected silver miniwires in the treated region using this silver ink core component combined with the listed shell components were all unsuccessful.

Comparative Example A2

The silver ink core component used comprised 60 wt % silver nanoparticles dispersed in water (Available from PChem Associates, Inc. as PFI-722 ink). A variety of shell components were used including the following:
  6 wt % polyacrylic acid in water;
  4 wt % polyethylene oxide in a 60/40 wt % ethanol/water mixture;
  6 wt % polyethylene oxide in a 60/40 wt % isopropanol/water mixture;
  8 wt % polyacrylic acid in a 30/20/50 wt % water/isopropanol/butanol mixture;
  4-6 wt % polyethylene oxide in a 60/40 wt % ethanol/water mixture;
  4-8 wt % polyacrylic acid in a 60/40 wt % ethanol/water mixture; and,
  4-8 wt % polyacrylic acid in a 40/60 wt % ethanol/water mixture.

The interfacial tension between the silver ink core component and the shell component in each of these systems was measured to be 0.4-2 mN/m.

Efforts to produce a plurality of interconnected silver miniwires in the treated region using this silver ink core component combined with the listed shell components were all unsuccessful.

We claim:

1. A method of manufacturing a patterned transparent conductor, comprising:
   providing a silver ink core component containing silver nanoparticles dispersed in a silver carrier;
   providing a shell component containing a film forming polymer dispersed in a shell carrier;
   providing a substrate;
   coelectrospinning the silver ink core component and the shell component to form a core shell fiber having a core and a shell surrounding the core, wherein the silver nanoparticles are in the core;
   depositing the core shell fiber on the substrate to provide a deposited core shell fiber;
   selectively treating a portion of the deposited core shell fiber to provide a patterned transparent conductor, wherein the patterned transparent conductor has a treated region and a non-treated region;
   wherein the treated region comprises a plurality of electrically interconnected silver miniwires and wherein the treated region is an electrically conductive region; and,
   wherein the non-treated region is an electrically insulative region.

2. The method of claim 1, wherein the treated region is formed in a controlled pattern on the substrate.

3. The method of claim 2, wherein the controlled pattern is a regular pattern.

4. The method of claim 2, wherein the controlled pattern is an irregular pattern.

5. The method of claim 2, wherein the controlled pattern grid pattern is an irregular grid pattern.

6. The method of claim 1, wherein the patterned transparent conductor exhibits a $\Delta_{Trans}$ of $\leq 1\%$.

7. The method of claim 1, wherein the patterned transparent conductor exhibits a $\Delta_{Haze}$ of $\leq 1\%$.

8. The method of claim 6, wherein the patterned transparent conductor exhibits a $\Delta_{Haze}$ of $\leq 1\%$.

9. The method of claim 1, wherein selectively treating a portion of the deposited core shell fiber to provide a patterned transparent conductor, comprises: selectively treating the portion of the deposited core shell fiber using a technique selected from the group consisting of sintering; heating and a combination thereof.

* * * * *